US011545626B2

(12) United States Patent
Kim et al.

(10) Patent No.: US 11,545,626 B2
(45) Date of Patent: Jan. 3, 2023

(54) DEPOSITION MASK ASSEMBLY FOR DISPLAY DEVICES

(71) Applicant: Samsung Display Co., Ltd., Yongin-si (KR)

(72) Inventors: Jinyeong Kim, Hwaseong-si (KR); Haseok Jeon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 517 days.

(21) Appl. No.: 15/867,918

(22) Filed: Jan. 11, 2018

(65) Prior Publication Data

US 2018/0198067 A1 Jul. 12, 2018

(30) Foreign Application Priority Data

Jan. 12, 2017 (KR) ........................ 10-2017-0005076

(51) Int. Cl.
*H01L 51/00* (2006.01)
*H01L 51/56* (2006.01)
*C23C 16/04* (2006.01)
*C23C 14/04* (2006.01)

(52) U.S. Cl.
CPC ........ *H01L 51/0011* (2013.01); *C23C 14/042* (2013.01); *C23C 16/042* (2013.01); *H01L 51/56* (2013.01)

(58) Field of Classification Search
None
See application file for complete search history.

(56) References Cited

U.S. PATENT DOCUMENTS 5,853,805 A * 12/1998 Mizuguchi ............... H03H 3/02 427/250
6,995,495 B2 * 2/2006 Ko ........................ B81B 3/0062 310/309
9,065,078 B2 6/2015 Kim
9,166,166 B2 10/2015 Kim et al.
2002/0156170 A1 * 10/2002 Border ..................... G02B 1/04 524/433
2004/0020435 A1 * 2/2004 Tsuchiya ............... C23C 14/042 118/723 VE (Continued)

FOREIGN PATENT DOCUMENTS

KR 10-2014-0124285 10/2014
KR 10-2014-0134158 11/2014

(Continued)

*Primary Examiner* — Jeffrie R Lund
*Assistant Examiner* — Tiffany Z Nuckols
(74) *Attorney, Agent, or Firm* — H.C. Park & Associates, PLC

(57) ABSTRACT

A deposition mask assembly for manufacturing a plurality of display devices includes a frame having an opening area, a first open mask disposed on the frame and having a first body portion defining a plurality of patterns overlapping the opening area, and a second open mask disposed on the first open mask and having a second body portion defining a plurality of opening portions overlapping the patterns of the first open mask, in which each of the patterns includes an auxiliary pattern spaced apart from the first body portion and a first bridge pattern connecting the first body portion and the auxiliary pattern.

25 Claims, 7 Drawing Sheets

10
320
300
310
220
200
210
100
101
D2 D3 D1

(56) References Cited

U.S. PATENT DOCUMENTS

2011/0067630 A1* 3/2011 Ko ........................ C23C 14/042
118/721
2015/0159267 A1* 6/2015 Ochi ..................... C23C 16/042
118/721
2016/0001542 A1* 1/2016 Saito ....................... B32B 38/10
156/247
2016/0296966 A1* 10/2016 Hong ....................... B05D 1/32
2017/0222145 A1* 8/2017 Kim .................... H01L 51/0011
2018/0209029 A1* 7/2018 Lin ....................... C23C 14/042

FOREIGN PATENT DOCUMENTS

KR 10-2015-0071321 6/2015
KR 10-1659960 9/2016

* cited by examiner

DEPOSITION MASK ASSEMBLY FOR DISPLAY DEVICES

CROSS-REFERENCE TO RELATED APPLICATION

This application claims priority from and the benefit of Korean Patent Application No. 10-2017-0005076, filed on Jan. 12, 2017, which is hereby incorporated by reference for all purposes as if fully set forth herein.

BACKGROUND

Field

Exemplary implementations of the invention relate generally to a deposition mask assembly, and more particularly, to a deposition mask assembly capable of manufacturing a display device having a narrow bezel.

Discussion of the Background

Display devices may be classified into liquid crystal display ("LCD") devices, organic light emitting diode ("OLED") display devices, plasma display panel ("PDP") devices, electrophoretic display devices, or the like, based on a light emitting scheme thereof.

Among these, OLED display devices are garnering attention as an ideal display device of the next generation because they have excellent display characteristics, such as a contrast ratio and a response time, and can easily be implemented as flexible display devices.

In general, OLED display devices include a substrate, on which a cathode and an anode surround several layers of thin films including organic materials. When a voltage is applied to the cathode and the anode, a current flows in the organic thin film to create a light emission phenomenon. More particularly, organic molecules may be excited to an energized state in response to the applied current, which then return to a ground state, during which extra energy is released as light. As such, in order to form an OLED display device including a plurality of organic thin film layers, it is important to deposit an organic thin film having a uniform thickness over the entire substrate.

The types of masks used in such a deposition process may include a fine metal mask (FMM) used to perform a precise patterning on various locations of a display area of a display device, and an open mask used to form a common thin film layer over the entire display area. For example, when deposition material should be precisely deposited only at a predetermined pixel position in the display area, such as a light emission layer, the fine metal mask is used. On the other hand, when a deposition material should be deposited over the entire display area, such as an electron injection layer, an electron transport layer, a hole injection layer, and a hole transport layer, an open mask having an entire area opened is used.

Recently, as display devices include a narrow bezel, at least one of a camera hole, a sensor hole, an LED hole, and a speaker hole may be positioned within the display area of the display device. Accordingly, it is necessary to manufacture the display using an open mask including a pattern corresponding to the hole.

It is to be understood that this background of the technology section is intended to provide useful background for understanding the technology, and as such disclosed herein, the technology background section may include ideas, concepts or recognitions that do not constitute prior art.

SUMMARY

Deposition mask assemblies constructed according to exemplary implementations of the invention are capable of implementing a display device including a narrow bezel.

According to one or more implementations of the invention, a deposition mask assembly includes a frame having an opening area, a first open mask disposed on the frame, the first open mask having a first body portion defining a plurality of pattern portions overlapping the opening area, and a second open mask disposed on the first open mask, the second open mask having a second body portion defining a plurality of opening portions overlapping the pattern portions of the first open mask, in which each of the pattern portions includes an auxiliary pattern spaced apart from the first body portion and a first bridge pattern connecting the first body portion and the auxiliary pattern.

The shapes of the first body portion and the second body portion may be substantially the same.

The auxiliary pattern may have one of a circular shape, an elliptical shape, and a polygonal shape.

The first bridge pattern may have a plurality of lines.

The lines connected to opposing sides of the auxiliary pattern may be disposed along substantially the same imaginary straight line.

Each of the pattern portions may further include a second bridge pattern parallel to the first bridge pattern.

The lines of the first connection pattern connected to opposing sides of the may be substantially parallel to each other.

The lines of the first bridge pattern may extend longitudinally in directions that intersect each other.

The first bridge pattern may have a lattice shape.

A ratio of a thickness of the second open mask to a width of the first bridge pattern may be in a range from about 1:1 to about 1:10.

The second open mask may have a thickness in a range from about 50 μm to about 200 μm.

The auxiliary pattern may include a first auxiliary pattern and a second auxiliary pattern.

The first auxiliary pattern may have a size different from a size of the second auxiliary pattern when viewed in plan.

Each of the first open mask and the second open mask may include one of stainless steel (SUS), an INVAR™ alloy, nickel (Ni), cobalt (Co), a nickel alloy, and a nickel-cobalt alloy.

The first open mask and the second open mask may include substantially the same material.

The first open mask and the second open mask may be integrally formed.

According to one or more implementations of the invention, a deposition apparatus for manufacturing a plurality of display devices includes a deposition source, a deposition mask assembly, and a display substrate to which the deposition source is deposited, the display substrate including a first area configured not to be deposited with material from the deposition source and a second area configured to be deposited with material from the deposition source. The deposition mask assembly includes a frame having an opening area, a first open mask disposed on the frame, the first open mask including a plurality of pattern portions overlapping the opening area and a first body portion surrounding the pattern portions, and a second open mask disposed on the first open mask, the second open mask including a plurality of opening portions overlapping the pattern portions of the first open mask and a second body portion surrounding the opening portions. Each of the pattern portions includes an auxiliary pattern spaced apart from the first body portion and overlapping the first area, and a first bridge pattern connecting the first body portion and the auxiliary pattern and overlapping the second area.

A ratio of a thickness of the second open mask to a width of the first bridge pattern is in a range from about 1:1 to about 1:10.

The auxiliary pattern may have a width greater than a width of the first bridge pattern.

A portion of the display substrate overlapping the first bridge pattern may be configured to be deposited with material from the deposition source.

The foregoing is illustrative only, and is not intended to be in any way limiting. In addition to the illustrative aspects, exemplary embodiments, and features described above, further aspects, exemplary embodiments, and features will become apparent by reference to the drawings, and the following detailed description.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
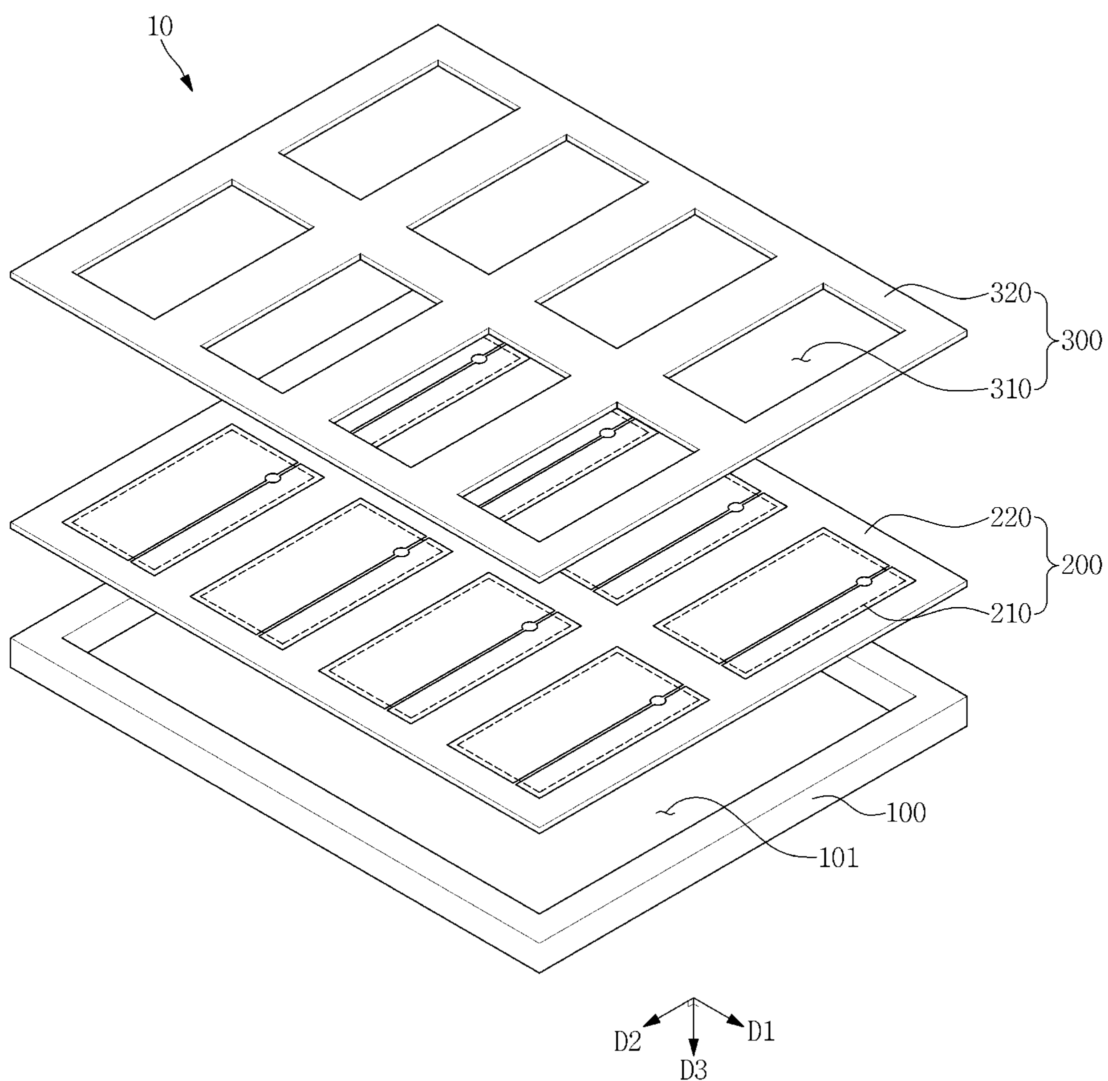
FIG. 1 is an exploded perspective view of an exemplary embodiment deposition mask assembly constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Hereinafter, an exemplary embodiment of a deposition mask assembly constructed according to the principles of the invention will be described in detail with reference to FIGS. 1, 2, 3A and 3B.

Figure 2:
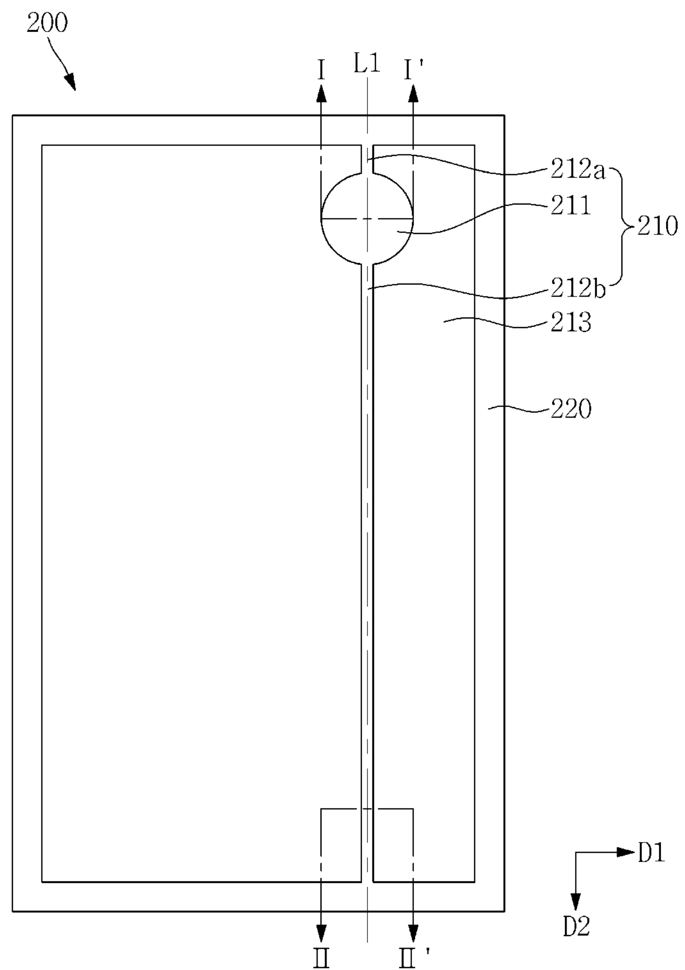
FIG. 2 is an enlarged plan view of a part of a first open mask according to an exemplary embodiment of the invention.
Figure 3A:
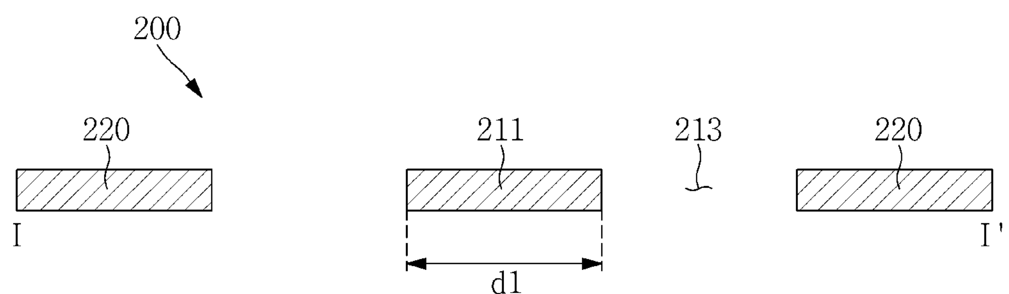
FIG. 3A is a cross-sectional view taken along line I-I' of FIG. 2.
Figure 3B:
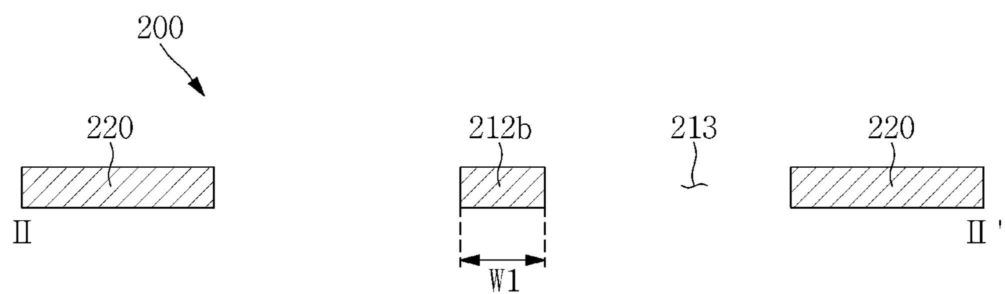
FIG. 3B is a cross-sectional view taken along line II-II' of FIG. 2.

FIG. 1 is an exploded perspective view of an exemplary embodiment of deposition mask assembly constructed according to the principles of the invention. FIG. 2 is an enlarged plan view illustrating a part of a first open mask according to an exemplary embodiment of the invention. FIG. 3A is a cross-sectional view taken along line I-I' of FIG. 2, and FIG. 3B is a cross-sectional view taken along line II-II' of FIG. 2.

Referring to FIGS. 1, 2, 3A and 3B, a deposition mask assembly 10 includes a frame 100, a first open mask 200, and a second open mask 300. Hereinafter, a long side direction of the frame 100 is referred to as a first direction D1, a short side direction of the frame 100 is referred to as a second direction D2, and a thickness direction of the frame 100 is referred to as a third direction D3.

The frame 100 defines an opening area 101 located at a central portion of the frame 100. More particularly, as illustrated in FIG. 1, the frame 100 may have a quadrangular shape that corresponds to a deposition object, such as a substrate, and may have the opening area 101 having a quadrangular shape at the central portion thereof to perform a deposition process on the deposition object, which may be a substrate for multiple display devices.

The first open mask 200 and the second open mask 300 are disposed on the frame 100. The first and second open masks 200 and 300 may be fastened on the frame 100 under a tensile force in the first and second directions D1 and D2. For example, each of the first and second open masks 200 and 300 may be fastened by welding, such as spot welding. The spot welding may reduce deformation of the first and second open masks 200 and 300 during welding by forming a plurality of welding points and welding them respectively. The welding points may be, for example, in the form of at least one column or multiple columns in a zigzag orientation.

Accordingly, the frame 100 may receive a compressive force in response to the tensile force in the first and second directions D1 and D2, and may be deformed by heat generated during welding. Accordingly, the frame 100 includes a metal having high rigidity in order to substantially minimize the deformation that may be caused by the compressive force acting on the frame 100 or heat.

The first open mask 200 includes a plurality of pattern portions 210 and a first body portion 220 defining the pattern portions 210.

The pattern portions 210 overlap the opening area 101 of the frame 100. According to an exemplary embodiment, one pattern portion 210 may correspond to one display device area. For example, as illustrated in FIG. 1, the first open mask 200 according to an exemplary embodiment may include eight pattern portions 210. Accordingly, the size of the first open mask 200 may correspond to at least eight display device areas. However, the inventive concepts are not limited thereto, and the number and size of the pattern portions 210 may be varied according to process conditions of the display device.

Each of the pattern portions 210 includes an auxiliary pattern 211 and first bridge patterns 212*a* and 212*b*. The pattern portions 210 may include one of stainless steel (SUS), an INVAR™ alloy, nickel (Ni), cobalt (Co), a nickel alloy, and a nickel-cobalt alloy.

The auxiliary pattern 211 is spaced apart from the first body portion 220. The auxiliary pattern 211 may have one of a circular shape, an elliptical shape, and a polygonal shape when viewed in plan. For example, as illustrated in FIGS. 1, and 2, the auxiliary pattern 211 according to an exemplary embodiment may have a circular shape when viewed in plane.

The auxiliary pattern 211 may overlap the display area of the display device in the deposition process of forming a common thin film layer over an entire surface of the display device. The auxiliary pattern 211 may correspond to one hole positioned in the display area of the display device. For example, the hole may be one of a camera hole, a sensor hole, an LED hole, and a speaker hole of the display device.

As demand for display devices with a narrow bezel has increased recently, at least one of a camera hole, a sensor hole, an LED hole, and a speaker hole may be located within the display area of the display device. In this case, during a deposition process using an open mask, a deposition material should not be deposited in the hole located in the display area. Accordingly, the first open mask 200 includes the auxiliary pattern 211 to prevent the deposition material from being deposited in an area of the display device corresponding to the hole located in the display area.

The size of the auxiliary pattern 211 may be determined in accordance with the size of the hole. For example, as illustrated in FIG. 3A, a diameter d1 of the auxiliary pattern 211 having a circular shape may be greater than the diameter of the hole located in the display area of the display device, in consideration of a shadow phenomenon occurring in the deposition process, which will be described in more detail below.

The first bridge patterns 212*a* and 212*b* connect the auxiliary pattern 211 and the first body portion 220 together. Accordingly, in the deposition process, the location of the auxiliary pattern 211 may be fixed. For example, during the deposition process, the position of the auxiliary pattern 211 may be fixed at a location corresponding to at least one of a camera hole, a sensor hole, an LED hole, and a speaker hole of the display device.

The first bridge patterns 212*a* and 212*b* may each be a substantially straight line. The lines may be arranged along the same imaginary straight line. For example, the first bridge patterns 212*a* and 212*b* may be arranged along an imaginary straight line L1 extending in the second direction D2, as illustrated in FIG. 2. However, the inventive concepts are not limited thereto, and the first bridge patterns 212*a* and 212*b* may be arranged along different imaginary straight (or curved) lines, respectively.

The first bridge patterns 212*a* and 212*b* may overlap the display area and the non-display area of the display device during the deposition process of forming the common thin film layer. However, the first bridge patterns 212*a* and 212*b* may not substantially prevent deposition of the deposition material onto the display area and the non-display area overlapping the first bridge patterns 212*a* and 212*b*, unlike the auxiliary pattern 211. That is, the common thin film layer may be formed over the entire surface of the display device except the area corresponding to the auxiliary pattern 211.

Accordingly, sizes of the first bridge patterns 212*a* and 212*b* may be determined within a range that may not substantially prevent deposition of the deposition material in the display area and the non-display area overlapping the first bridge patterns 212*a* and 212*b*. That is, widths of the lines forming the first bridge patterns 212*a* and 212*b* may be determined within a range that may not substantially prevent deposition of the deposition material. For example, as illustrated in FIG. 3B, a width W1 of the first bridge pattern 212*b* may be determined in consideration of the shadow phenomenon that may occur during the deposition process, which will be described in detail below.

The first body portion 220 may include one of stainless steel (SUS), an INVAR™ alloy, nickel (Ni), cobalt (Co), a nickel alloy, and a nickel-cobalt alloy. The first body portion 220 may include a material substantially the same as a material included in the auxiliary pattern 211 and the first bridge patterns 212*a* and 212*b*. In addition, the first body portion 220 may be formed integrally with the auxiliary pattern 211, and the first bridge patterns 212*a* and 212*b*.

An opening pattern 213 of the first open mask 200 may be defined by the auxiliary pattern 211, the first bridge patterns 212*a* and 212*b*, and the first body portion 220. The deposition material may pass through the opening pattern 213 and deposited on the substrate S to be described below.

The second open mask 300 includes a plurality of opening portions 310 and a second body portion 320 defining the opening portions 310.

The opening portions 310 overlap the pattern portions 210 of the first open mask 200, respectively. According to an exemplary embodiment, one opening portion 310 may correspond to one display device area. For example, as illustrated in FIG. 1, the second open mask 300 may include eight opening portions 310. Accordingly, the size of the second open mask 300 may correspond to at least eight display device areas. However, the inventive concepts are not limited thereto, and the number and size of the opening portions 310 may be varied according to process conditions of the display device. The deposition material may pass through the opening portions 310 and be deposited on the substrate S.

The second body portion 320 may have a shape substantially identical to the shape of the first body portion 220. The second body portion 320 may include one of stainless steel (SUS), an INVAR™ alloy, nickel (Ni), cobalt (Co), a nickel alloy and a nickel-cobalt alloy. Although the second body portion 320 is illustrated as being formed separately from the first body portion 220, the inventive concepts are not limited thereto. The second body portion 320 may be formed integrally with the first body portion 220. That is, the second open mask 300 may be formed integrally with the first open mask 200.

Hereinafter, an exemplary deposition process of a display device using the deposition mask assembly according to an exemplary embodiment will be described in detail with reference to FIGS. 4 and 5.

Figure 4:
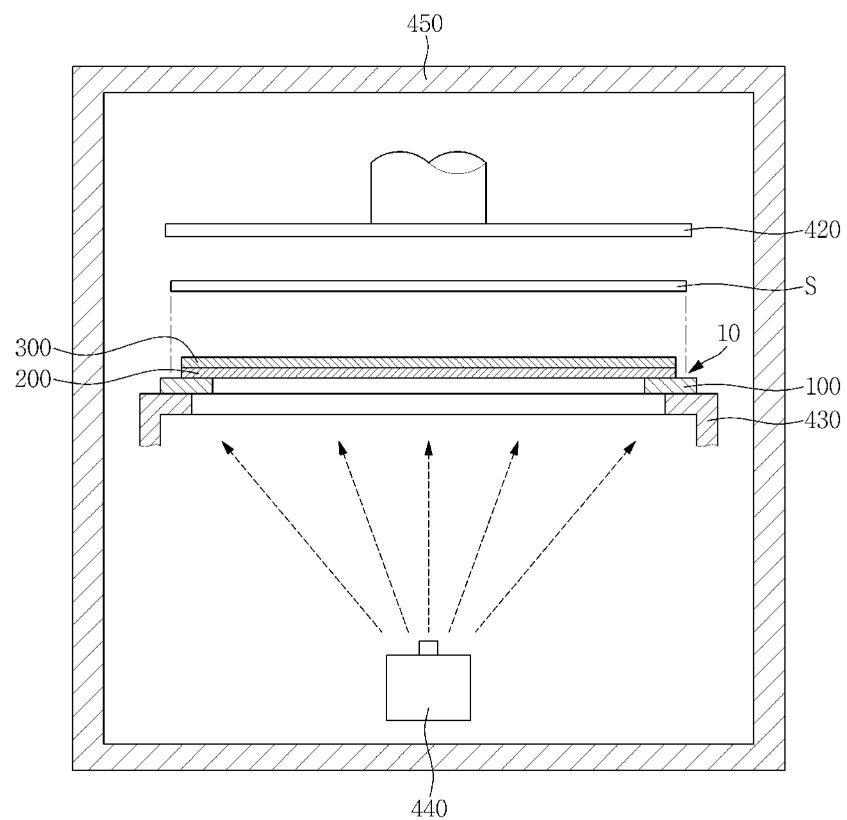
FIG. 4 and FIG. 5 are cross-sectional views illustrating a deposition process of a display device using a deposition mask assembly according to an exemplary embodiment of the invention.
Figure 5:
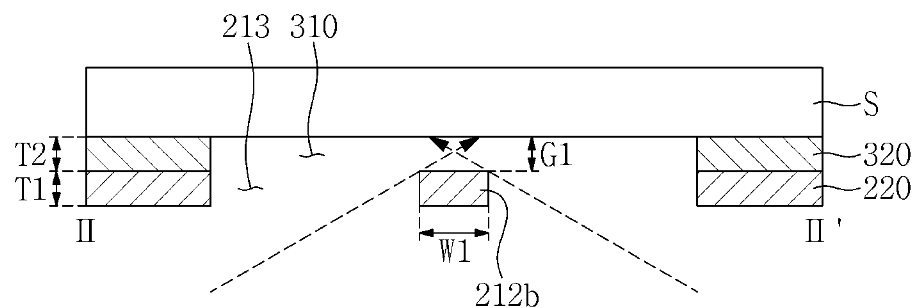

FIGS. 4 and 5 are cross-sectional views illustrating a deposition process of a display device using a deposition mask assembly according to an exemplary embodiment. In particular, the deposition mask assembly illustrated in FIG. 5 corresponds to line II-II' of FIG. 2.

Referring to FIGS. 4 and 5, a deposition process apparatus according to an exemplary embodiment includes a deposition mask assembly 10, a magnet unit 420, a fastening member 430, a deposition source 440, and a chamber 450.

The deposition mask assembly 10 includes a frame 100, a first open mask 200, and a second open mask 300, and is located in the chamber 450 at an upper portion thereof to face the deposition source 440.

The magnet unit 420 opposes the deposition mask assembly 10 with the substrate S interposed therebetween, which is a deposition object. The second open mask 300 of the deposition mask assembly 10 may be brought into close contact with the substrate S by a magnetic force from the magnet unit 420.

The fastening member 430 supports an edge of the deposition mask assembly 10. The fastening member 430 is disposed outside a movement path of the deposition material supplied from the deposition source 440 to the substrate S.

The deposition source 440 is disposed below the deposition mask assembly 10. The deposition source 440 supplies the deposition material to the substrate S through the opening pattern 213 of the first open mask 200 and the opening portion 310 of the second open mask 300. That is, the deposition material is supplied toward a deposition surface of the substrate S.

The deposition source 440 may be in the form of a crucible including a deposition material therein, and the deposition material may be vaporized by heat and deposited on the substrate S. The deposition process apparatus may further include a heater for heating the deposition material. The heater may be provided on opposite sides of the deposition source 440 to heat the deposition source 440, thereby heating and vaporizing the deposition material accommodated in the deposition source 440.

The chamber 450 provides a space for the deposition process. The chamber 450 is connected to a vacuum pump, such as a turbo molecular pump (TMP), so that the chamber 450 may be in a vacuum state during the deposition process. The chamber 450 may further include a deposition prevention plate disposed to surround an inner wall surface of the chamber 450. The deposition prevention plate may substantially prevent the remaining deposition material not deposited on the substrate S from being adsorbed on the inner wall surface of the chamber 450.

The substrate S is located on the deposition mask assembly 10. The substrate S may be aligned to overlap the opening area 101 of the deposition mask assembly 10.

The deposition process apparatus may further include a thickness monitoring sensor for measuring a velocity of the deposition material, a thickness controller for controlling the deposition source 440 according to the measured thickness, a shutter for blocking the deposition material vaporized from the deposition source 440, and the like. In addition, the deposition process apparatus may further include an aligner and a CCD camera disposed outside the chamber 450 to align the substrate S with the deposition mask assembly 10.

Hereinafter, an exemplary process of depositing a deposition material on the deposition surface of the substrate S will be described.

First, the deposition mask assembly 10 is fastened to the fastening member 430, and the substrate S is disposed above the second open mask 300.

Subsequently, the deposition source 440 located at a lower portion of the chamber 450 ejects the deposition material toward the deposition mask assembly 10. For example, when power is applied to a heater connected to the deposition source 440, the deposition source 440 accommodating the deposition material is heated, and the deposition material is heated and vaporized to be ejected toward the deposition mask assembly 10. In this case, the inside of the chamber 450 is maintained at a high degree of vacuum at a high temperature.

When the deposition material is ejected, the deposition material is deposited over the deposition surface of the substrate S through the opening pattern 213 of the first open mask 200 and the opening portion 310 of the second open mask 300. As described above, the deposition mask assembly 10 according to an exemplary embodiment includes the first open mask 200 including the pattern portion 210, such that a common thin film layer may be formed over substantially the entire surface of the substrate S except an area corresponding to the auxiliary pattern 211.

In particular, since the first open mask 200 includes the auxiliary pattern 211, which overlaps the display area of the display device and corresponds to one of the holes located in the display area of the display device, the deposition material may not be deposited at an area corresponding to the hole located in the display area during the deposition process.

In addition, the first open mask 200 includes first bridge patterns **212*a* and 212*b*, which overlap the display area and the non-display area of the display device during the deposition process. In this case, widths of the lines forming the first bridge patterns 212*a* and 212*b*** may be determined within a range that may not substantially prevent deposition of the deposition material in the overlapping area.

For example, as illustrated in FIG. 5, when the thickness of the first open mask 200 is defined as a first thickness T1, and a thickness of the second open mask 300 is defined as a second thickness T2, a gap G1 between the first bridge pattern **212*b* of the first open mask 200 and the substrate S is substantially equal to the second thickness T2. Accordingly, since the first bridge pattern 212*b* and the substrate S are spaced apart from each other by the second thickness T2 when viewed in plan, the deposition material may be deposited on a portion of the substrate S overlapping the first bridge pattern 212*b* due to a shadow phenomenon, as shown in FIG. 5**.

According to an exemplary embodiment, a ratio (T2:W1) of the second thickness T2 of the second open mask 300 to the width W1 of the first bridge pattern **212*b* that would not substantially prevent deposition of the deposition material at a portion of the substrate S overlapping the first bridge pattern 212*b* may be in a range from about 1:1 to about 1:10. For example, the second open mask 300 may have a thickness in a range from about 50 μm to about 200 μm. When the second thickness T2 of the second open mask 300 is less than about 50 μm, the gap G1 between the first bridge pattern 212*b* and the substrate S may be decreased, which may relatively mitigate the shadow phenomenon. More particularly, the deposition material may not be deposited on a portion of the substrate S overlapping the first bridge pattern 212*b*. On the other hand, when the second thickness T2 of the second open mask 300 is greater than about 200 μm, the overall thickness of the deposition mask assembly 10** may be increased, which may deteriorate deposition accuracy.

In addition, the width W1 of the first bridge pattern **212*b* may be determined in consideration of the gap G1 between the first bridge pattern 212*b* and the substrate S, and the rigidity and process margin of the first open mask 200. For example, when the width W1 of the first bridge pattern 212*b* is too small, such as below 50 μm, the rigidity of the first open mask 200 may be lowered, which may cause deformation of the first open mask 200 from repetitive transfer, alignment, and cleaning. On the other hand, when the width W1 of the first bridge pattern 212*b* is excessively large, such as 2,000 μm, the area overlapped between the first bridge pattern 212*b* and the substrate S may be increased, which may prevent the deposition material from being deposited on a portion of the substrate S overlapping the first bridge pattern 212*b***.

Accordingly, the second thickness T2 of the second open mask 300 and the width W1 of the first bridge pattern **212*b* may be adjusted, so that the deposition material may not be substantially prevented from being deposited in the overlap area between the first bridge pattern 212*b* and the substrate S. That is, by adjusting a gap between the first open mask 200 and the substrate S, and the widths of the first bridge patterns 212*a* and 212*b*, the deposition material may be deposited on a portion of the substrate S overlapping the first bridge patterns 212*a* and 212*b***.

Accordingly, since the deposition mask assembly 10 includes the first open mask 200 including the pattern portion 210, a common thin film layer is formed over substantially the entire surface of the substrate S except the area corresponding to the auxiliary pattern 211.

Hereinafter, an OLED display device manufactured using the deposition mask assembly according to an exemplary embodiment will be described in detail with reference to FIG. 6.

Figure 6:
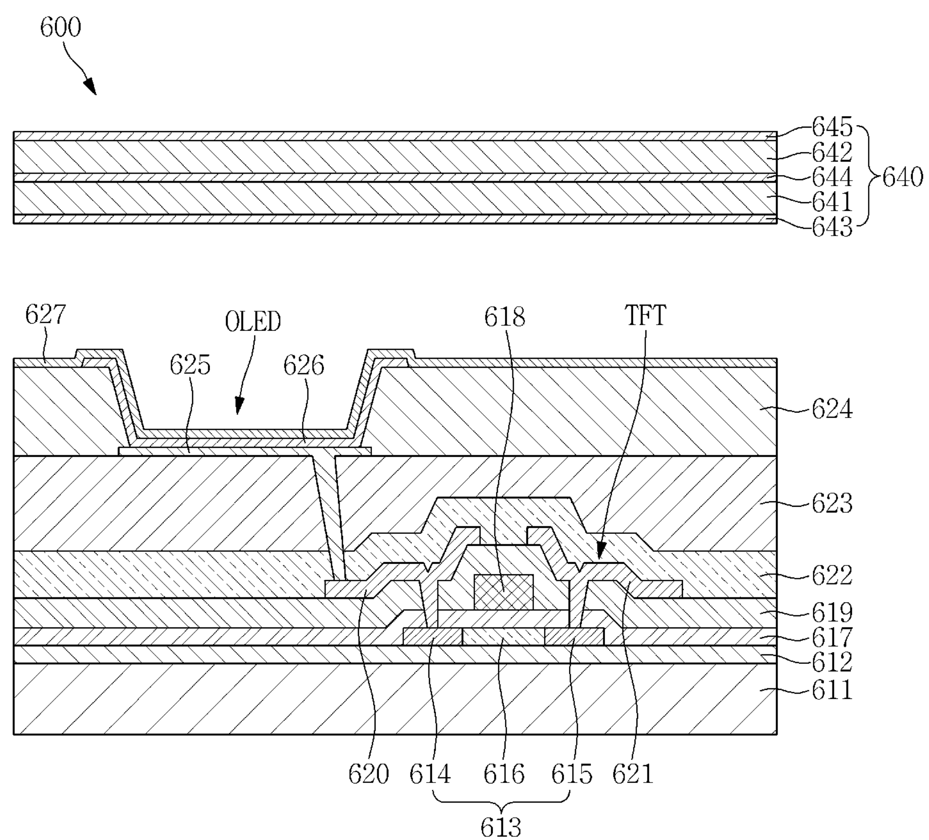
FIG. 6 is an exploded cross-sectional view of an OLED display device manufactured using a deposition mask assembly according to an exemplary embodiment of the invention.

FIG. 6 is an exploded cross-sectional view illustrating an OLED display device manufactured using a deposition mask assembly according to an exemplary embodiment.

Referring to FIG. 6, an OLED display device 600 includes a base substrate 611, a barrier layer 612, a semiconductor active layer 613, a gate insulation layer 617, an insulating interlayer 619, a source electrode 620, a drain electrode 621, a passivation layer 622, a planarization layer 623, a pixel defining layer 624, an OLED, and an encapsulation portion 640.

The base substrate 611 may include an insulating material having flexibility. For example, the base substrate 611 may include a polymer material, such as polyimide (PI), polycarbonate (PC), polyethersulphone (PES), polyethylene terephthalate (PET), polyethylene naphthalate (PEN), polyarylate (PAR), fiberglass reinforced plastic (FRP), or the like. Alternatively, the base substrate 611 may be a glass substrate. The base substrate 611 may be transparent, translucent, or opaque.

The barrier layer 612 is disposed on the base substrate 611. The barrier layer 612 may be disposed to cover an entire portion of an upper surface of the base substrate 611. The barrier layer 612 may include an inorganic layer or an organic layer. The barrier layer 612 may have a single layer structure or a multilayer structure. For example, the barrier layer 612 may include at least one selected from inorganic materials, such as silicon oxide ($SiO_x$), silicon nitride ($SiN_x$), silicon oxynitride (SiON), aluminum oxide (AlO), and aluminum nitride (AlON), or organic materials, such as acryl, polyimide, polyester, or the like.

The barrier layer 612 serves to substantially block oxygen and moisture, substantially prevent diffusion of moisture or impurities through the base substrate 611, and provide a flat surface on the top of the base substrate 611. A thin film transistor (TFT) is formed on the barrier layer 612. Although FIG. 6 illustrates the TFT as a top gate type TFT, the inventive concepts are not limited thereto. For example, the TFT according to an exemplary embodiment may be different types of TFT, such as a bottom gate type TFT.

The semiconductor active layer 613 is disposed on the barrier layer 612. The semiconductor active layer 613 includes a source area 614, a drain area 615, and a channel area 616. The semiconductor active layer 613 is doped with N-type or P-type impurity ions to form the source area 614 and the drain area 615. An area between the source area 614 and the drain area 615 corresponds to the channel area 616, where no impurity is doped.

The semiconductor active layer 613 may include polysilicon or amorphous silicon. In addition, the semiconductor active layer 613 may include an oxide semiconductor. For example, the oxide semiconductor may include an oxide of an element selected from metals of groups 4, 12, 13, or 14, such as zinc (Zn), indium (In), gallium (Ga), tin (Sn), cadmium (Cd), germanium (Ge), hafnium (Hf), and combinations thereof.

The gate insulation layer 617 is disposed on the semiconductor active layer 613. The gate insulation layer 617 may include an inorganic layer, such as silicon oxide, silicon nitride, or a metal oxide. The gate insulation layer 617 may have a single layer structure or a multilayer structure.

A gate electrode 618 is disposed on the gate insulation layer 617. The gate electrode 618 may have single layer structure or a multilayer structure, and may include Au, Ag, Cu, Ni, Pt, Pd, Al, Mo, Cr, and/or the like or a metal alloy such as Al:Nd or Mo:W.

The insulating interlayer 619 is disposed on the gate electrode 618. The insulating interlayer 619 may include an insulating material such as silicon oxide or silicon nitride. In addition, the insulating interlayer 619 may include an insulating organic layer.

The source electrode 620 and the drain electrode 621 are disposed on the insulating interlayer 619. A contact hole may be defined in the gate insulation layer 617 and the insulating interlayer 619 by removing a part of the gate insulation layer 617 and the insulating interlayer 619. The source area 614 and the source electrode 620 may be electrically connected to each other through the contact hole, and the drain electrode 615 and the drain electrode 621 may be electrically connected to each other through the contact hole.

The passivation layer 622 is disposed on the source electrode 620 and the drain electrode 621. The passivation layer 622 may include an inorganic layer, such as silicon oxide or silicon nitride, or an organic layer.

The planarization layer 623 is disposed on the passivation layer 622. The planarization layer 623 includes an organic layer, such as acryl, polyimide, or benzocyclobutene (BCB).

The OLED may be formed on the TFT. The OLED includes a first electrode 625, a second electrode 627, and an intermediate layer 626 interposed between the first electrode 625 and the second electrode 627.

The first electrode 625 is electrically connected to one of the source electrode 620 and the drain electrode 621 through the contact hole. The first electrode 625 corresponds to a pixel electrode.

The first electrode 625 functions as an anode, and may include various conductive materials. The first electrode 625 may be a transparent electrode or a reflective electrode. For example, when the first electrode 625 is a transparent electrode, the first electrode 625 may include ITO, IZO, ZnO, $In_2O_3$, or the like. Alternatively, when the first electrode 625 is a reflective electrode, the first electrode 625 may include a reflective layer and a layer on the reflective layer. The reflective layer may include Ag, Mg, Al, Pt, Pd, Au, Ni, Nd, Ir, Cr, or a chemical compound thereof, and the layer on the reflective layer may include ITO, IZO, ZnO, $In_2O_3$, or the like.

The pixel defining layer (PDL) 624 is disposed on the planarization layer 623 to cover an edge of the first electrode 625. The pixel defining layer 624 defines a light emission area of each sub-pixel by surrounding the edge of the first electrode 625.

The pixel defining layer 624 includes an organic material or an inorganic material. For example, the pixel defining layer 624 may include an organic material such as polyimide, polyamide, benzocyclobutene, an acrylic resin, or a phenol resin, or an inorganic material such as $SiN_x$. The pixel defining layer 624 may have a single layer structure or a multilayer structure.

The intermediate layer 626 is disposed on the first electrode 625. The intermediate layer 626 may be disposed in an area that is exposed by etching a part of the pixel defining layer 624. The intermediate layer 626 may be formed by a deposition process.

The intermediate layer 626 may include a low molecular organic material or a high molecular organic material. The intermediate layer 626 may include an organic emissive layer EML. In addition, the intermediate layer 626 may further include at least one of a hole injection layer HIL, a hole transport layer HTL, an electron transport layer ETL, and an electron injection layer EIL, in addition to the organic emissive layer EML. However, the inventive concepts are not limited thereto, and the intermediate layer 626 may further include various other functional layers, in addition to the organic emissive layer EML.

The second electrode 627 is disposed on the intermediate layer 626. The second electrode 627 corresponds to a common electrode. The second electrode 627 may be a transparent electrode.

The first electrode 625 may be disposed to have a shape corresponding to an opening of each pixel defining layer 624. On the other hand, the second electrode 627 may be deposited over an entire surface of the substrate 611. Alternatively, the second electrode 627 may have a specific pattern, instead of being disposed over the entire surface of the substrate 611. According to an exemplary embodiment, the stacked sequence of the first electrode 625 and the second electrode 627 may be varied.

In an exemplary embodiment, the first electrode 625 and the second electrode 627 are insulated from each other by the intermediate layer 626. When a voltage is applied to the first electrode 625 and the second electrode 627, a visible light is emitted from the intermediate layer 626 to realize images that may be recognized by a user.

The encapsulation portion 640 is disposed on the OLED. The encapsulation portion 640 protects the intermediate layer 626 and other thin films from external moisture, oxygen, or the like.

The encapsulation portion 640 may have a structure having at least one organic layer and at least one inorganic layer stacked over one another. For example, the encapsulation portion 640 may have a structure, in which at least one organic layer 641 and 642 including, for example, epoxy, polyimide, polyethylene terephthalate, polycarbonate, polyethylene, or polyacrylate, and at least one inorganic layer 643, 644, or 645 including, for example, silicon oxide ($SiO_2$), silicon nitride ($SiN_x$), aluminum oxide ($Al_2O_3$), titanium oxide ($TiO_2$), zirconium oxide ($ZrO_x$), or zinc oxide (ZnO) are stacked.

The encapsulation portion 640 may have a structure including at least one layer of the organic layers 641 and 642 and at least two layers of the inorganic layers 643, 644, and 645. An uppermost layer 645 exposed to the outside of the encapsulation portion 640 may include an inorganic layer to substantially prevent moisture permeation to the OLED.

Hereinafter, a first open mask according to another exemplary embodiment will be described with reference to FIG. 7. The first open mask of FIG. 7 and the first open mask illustrated in FIG. 2 may have substantially similar elements. Accordingly, description of the substantially similar elements will be omitted to avoid redundancy.

Figure 7:
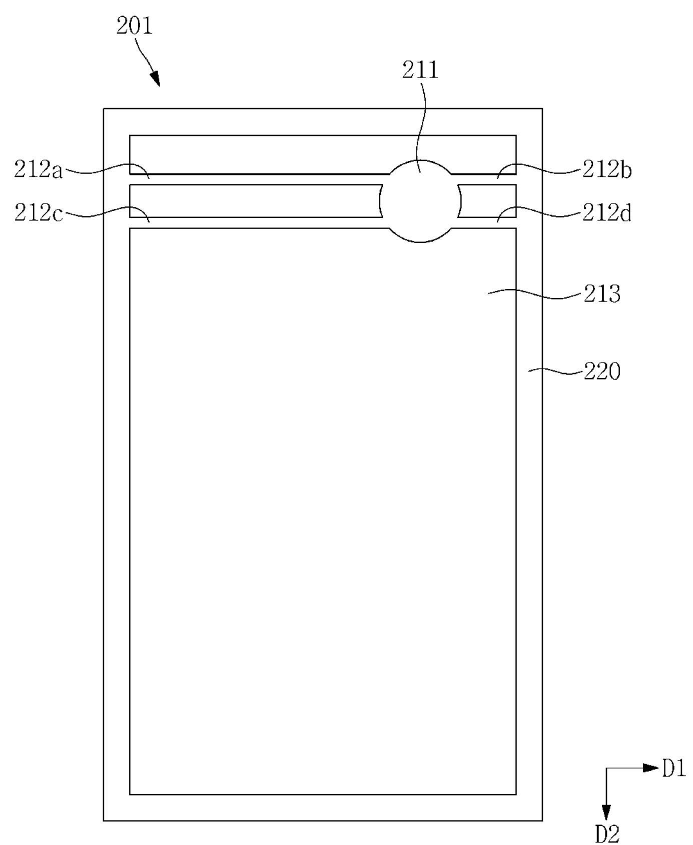
FIG. 7 is an enlarged plan view of a part of a first open mask according to another exemplary embodiment of the invention.

FIG. 7 is an enlarged plan view illustrating a part of a first open mask according to another exemplary embodiment.

Referring to FIG. 7, each of a plurality of pattern portions 210 (see FIG. 1) of a first open mask 201 includes an auxiliary pattern 211 and first bridge patterns 212*a*, 212*b*, 212*c*, and 212*d*.

The first bridge patterns 212*a*, 212*b*, 212*c*, and 212*d* include a plurality of lines. For example, two lines out of the lines may be disposed along the substantially same imaginary straight (or curved) line, or may be parallel to each other when extended along the corresponding imaginary straight line. For example, as illustrated in FIG. 7, the upper first bridge patterns 212*a* and 212*b* may be disposed along an imaginary straight line extending along a first direction D1, while the lower first bridge patterns 212*c* and 212*d* may be disposed along another imaginary straight line extending along the first direction D1. In this case, the two imaginary straight lines may be substantially parallel to each other.

Although the first bridge patterns 212*a*, 212*b*, 212*c*, and 212*d* of FIG. 7 are depicted as including four lines, the inventive concepts are not limited thereto. The first bridge patterns 212*a*, 212*b*, and 212*c*, 212*d* may include a greater number of lines in consideration of the rigidity of the first open mask 201.

Hereinafter, a first open mask according to another exemplary embodiment will be described with reference to FIG. 8. The first open mask of FIG. 8 and the first open mask illustrated in FIG. 2 may have substantially similar elements. Accordingly, description of the substantially similar elements will be omitted to avoid redundancy.

Figure 8:
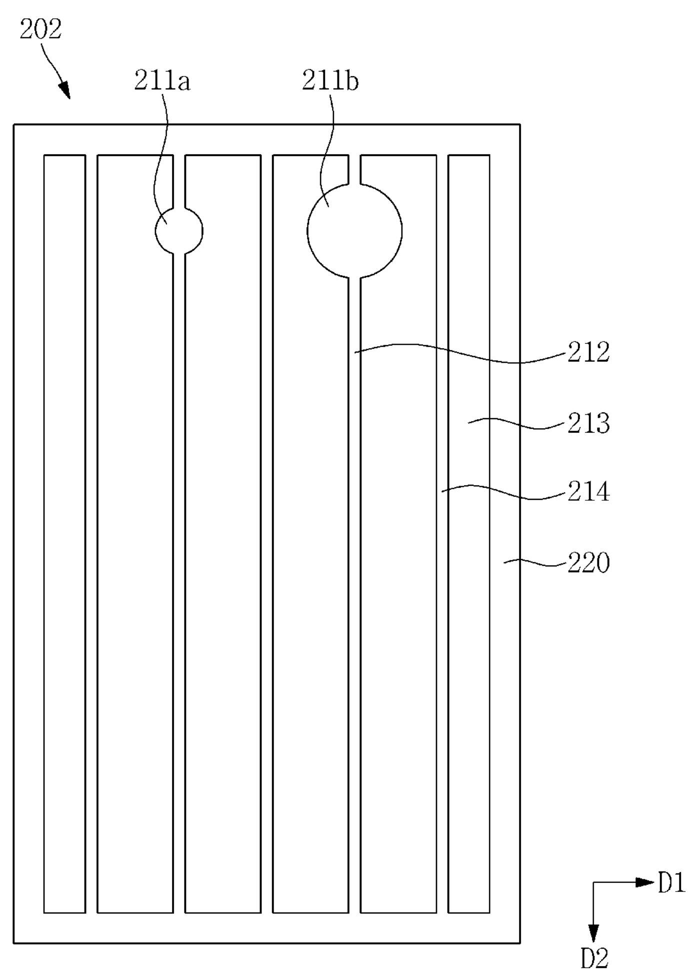
FIG. 8 is an enlarged plan view of a part of a first open mask according to yet another exemplary embodiment of the invention.

FIG. 8 is an enlarged plan view illustrating a part of a first open mask according to another exemplary embodiment.

Referring to FIG. 8, a plurality of pattern portions 210 (see FIG. 1) of a first open mask 202 includes a plurality of auxiliary pattern 211*a* and 211*b*, a first bridge pattern 212, and a second bridge pattern 214.

The auxiliary patterns 211*a* and 211*b* include a first auxiliary pattern 211*a* and a second auxiliary pattern 211*b*. Each of the first and second auxiliary patterns 211*a* and 211*b* is disposed apart from a first body portion 220. Each of the first and second auxiliary patterns 211*a* and 211*b* may have one of a circular shape, an elliptical shape, or a polygonal shape when viewed in plan. For example, as illustrated in FIG. 8, the first and second auxiliary patterns 211*a* and 211*b* may each have a circular shape when viewed in plan.

The first and second auxiliary patterns 211*a* and 211*b* overlap the display area of the display device during a deposition process of forming a common thin film layer disposed over an entire surface of the display device. Each of the first and second auxiliary patterns 211*a* and 211*b* corresponds to one hole located in the display area of the display device. For example, the hole may be one of a camera hole, a sensor hole, an LED hole, and a speaker hole of the display device.

Sizes of the first and second auxiliary patterns 211*a* and 211*b* may be determined in consideration of sizes of respective corresponding holes. For example, as illustrated in FIG. 8, a diameter of the first auxiliary pattern 211*a* may be less than a diameter of the second auxiliary pattern 211*b*. However, the inventive concepts are not limited thereto, and the diameter of the first auxiliary pattern 211*a* and the diameter of the second auxiliary pattern 211*b* may be substantially equal to each other.

The first bridge pattern 212 connects the first and second auxiliary patterns 211*a* and 211*b* with the first body portion 220, such that the first and second auxiliary patterns 211*a* and 211*b* may be fixed during the deposition process.

The second bridge pattern 214 is disposed parallel to the first bridge pattern 212. The second bridge pattern 214 is not directly connected to the first and second auxiliary patterns 211*a* and 211*b*, unlike the first bridge pattern 212. Since the first open mask 202 further includes the second bridge pattern 214, the rigidity of the first open mask 202 may be improved.

The width of each of the first bridge pattern 212 and the second bridge pattern 214 may be determined within a range that may not substantially prevent deposition of a deposition material on a substrate S. In addition, the widths of the first bridge pattern 212 and the second bridge pattern 214 may be equal to or different from each other.

The auxiliary patterns 211*a* and 211*b*, the first bridge pattern 212, the second bridge pattern 214, and the first body portion 220 may include a substantially same material. In addition, the auxiliary patterns 211*a* and 211*b*, the first bridge pattern 212, the second bridge pattern 214, and the first body portion 220 may be formed in a substantially same process.

Hereinafter, a first open mask according to another exemplary embodiment will be described with reference to FIG. 9. The first open mask of FIG. 9 and the first open mask illustrated in FIG. 2 may have substantially similar elements. Accordingly, description of the substantially similar elements will be omitted to avoid redundancy.

Figure 9:
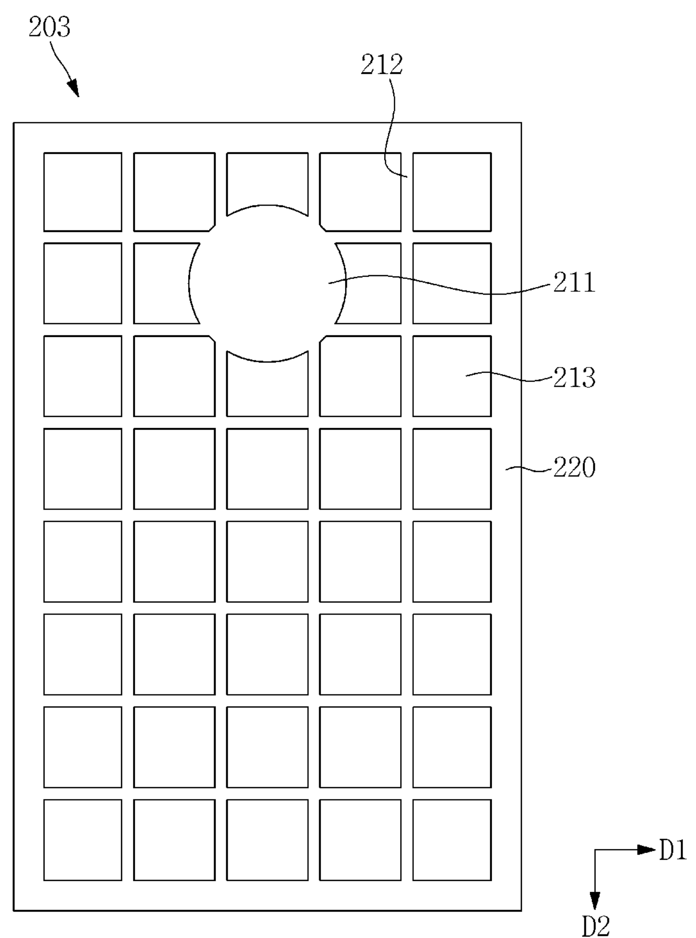
FIG. 9 is an enlarged plan view of a part of a first open mask according to still another exemplary embodiment of the invention.

FIG. 9 is an enlarged plan view illustrating a part of a first open mask according to still another exemplary embodiment.

Referring to FIG. 9, a plurality of pattern portions 210 (see FIG. 1) of a first open mask 203 includes an auxiliary pattern 211 and a first bridge pattern 212.

The first bridge pattern 212 includes a plurality of lines. In this case, two lines out of the lines may be disposed along substantially the same imaginary straight (or curved) line, or may be substantially parallel to each other or cross each other when extended along each corresponding imaginary straight line. For example, as illustrated in FIG. 8, the first bridge pattern 212 may have a lattice shape when viewed in plan.

Since the first open mask 203 includes the first bridge pattern 212 in the form of a lattice, the rigidity of the first open mask 203 may be improved.

As set forth hereinabove, according to one or more exemplary embodiments, the deposition mask assembly may form a common thin film layer of a display device including a narrow bezel by including first and second open masks.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A deposition mask assembly comprising:

a frame having an opening area;

a first open mask disposed on the frame, the first open mask having a first body portion defining a plurality of patterns, each of the patterns overlapping the opening area and having an opening through which a deposition material is configured to pass; and a second open mask disposed on the first open mask, the second open mask having a second body portion defining a plurality of opening portions overlapping the patterns, wherein each of the patterns comprises an auxiliary pattern within the corresponding opening and spaced apart from the first body portion, and a first bridge pattern connecting the first body portion and the auxiliary pattern, wherein the first open mask is disposed between the frame and the second open mask, and wherein a total opening area of the first open mask is less than a total opening area of the second open mask.

2. The deposition mask assembly of claim 1, wherein the shapes of the first body portion and the second body portion are substantially the same.

3. The deposition mask assembly of claim 1, wherein the auxiliary pattern has one of a circular shape, an elliptical shape, and a polygonal shape.

4. The deposition mask assembly of claim 1, wherein the first bridge pattern comprises a plurality of lines.

5. The deposition mask assembly of claim 4, wherein the lines connected to opposing sides of the auxiliary pattern are disposed along substantially the same imaginary straight line.

6. The deposition mask assembly of claim 5, wherein each of the patterns further comprises a second bridge pattern parallel to the first bridge pattern.

7. The deposition mask assembly of claim 4, wherein the lines of the first bridge pattern are substantially parallel to each other.

8. The deposition mask assembly of claim 4, wherein the lines of the first bridge pattern extend longitudinally in directions that intersect each other.

9. The deposition mask assembly of claim 8, wherein the first bridge pattern has a lattice shape.

10. The deposition mask assembly of claim 4, wherein a ratio of a thickness of the second open mask to a width of the first bridge pattern is in a range from about 1:1 to about 1:10.

11. The deposition mask assembly of claim 10, wherein the second open mask has a thickness in a range from about 50 μm to about 200 μm.

12. The deposition mask assembly of claim 1, wherein the auxiliary pattern comprises a first auxiliary pattern and a second auxiliary pattern.

13. The deposition mask assembly of claim 12, wherein the first auxiliary pattern has a size different from a size of the second auxiliary pattern when viewed in plan.

14. The deposition mask assembly of claim 1, wherein each of the first open mask and the second open mask comprises one of stainless steel (SUS), a nickel steel alloy, nickel (Ni), cobalt (Co), a nickel alloy, and a nickel-cobalt alloy.

15. The deposition mask assembly of claim 14, wherein the first open mask and the second open mask comprise substantially the same material.

16. The deposition mask assembly of claim 15, wherein the first open mask and the second open mask are integrally formed.

17. The deposition mask assembly of claim 1, wherein the auxiliary pattern and the first bridge pattern are formed on the same plane as the first open mask.

18. The deposition mask assembly of claim 1, wherein the opening of each of the plurality of patterns defined by the first body portion has an area substantially the same in a plan view as an area of each corresponding one of the opening portions defined by the second body portion.

19. The deposition mask assembly of claim 1, wherein a portion of the first body portion is disposed between the auxiliary patterns of adjacent patterns.

20. A deposition apparatus comprising:

a deposition source;

a deposition mask assembly; and a display substrate to which the deposition source is deposited, the display substrate having a first area configured not to be deposited with material from the deposition source and a second area configured to be deposited with material from the deposition source, wherein:

the deposition mask assembly comprises:

a frame having an opening area;

a first open mask disposed on the frame, the first open mask having a plurality of patterns overlapping the opening area and a first body portion surrounding the patterns, each of the patterns overlapping the opening area and having an opening through which the deposition source is configured to pass; and a second open mask disposed on the first open mask, the second open mask having a plurality of opening portions overlapping the patterns of the first open mask and a second body portion surrounding the opening portions;

each of the patterns comprises:

an auxiliary pattern within the corresponding opening, spaced apart from the first body portion, and overlapping the first area; and a first bridge pattern connecting the first body portion and the auxiliary pattern, and overlapping the second area;

the first open mask is disposed between the frame and the second open mask; and a total opening area of the first open mask is less than a total opening area of the second open mask.

21. The deposition apparatus of claim 20, wherein a ratio of a thickness of the second open mask to a width of the first bridge pattern is in a range from about 1:1 to about 1:10.

22. The deposition apparatus of claim 21, wherein a portion of the display substrate overlapping the first bridge pattern is configured to be deposited with material from the deposition source.

23. The deposition apparatus of claim 20, wherein the auxiliary pattern has a width greater than a width of the first bridge pattern.

24. A deposition mask assembly comprising:

a frame having an opening area;

a first open mask disposed on the frame, the first open mask having a first body portion defining a plurality of patterns, each of the patterns overlapping the opening area and having an opening through which a deposition material is configured to pass; and a second open mask disposed on the first open mask, the second open mask having a second body portion defining a plurality of opening portions overlapping the patterns, wherein each of the patterns comprises an auxiliary pattern within the corresponding opening and spaced apart from the first body portion, and a first bridge pattern connecting the first body portion and the auxiliary pattern, wherein no opening is defined in the auxiliary pattern, and wherein a total opening area of the first open mask is less than a total opening area of the second open mask.

25. The deposition mask assembly of claim 24, wherein a width of the first bridge pattern is less than a width of the auxiliary pattern.

* * * * *